United States Patent [19]
Johnston, Jr. et al.

[11] Patent Number: 4,878,956
[45] Date of Patent: Nov. 7, 1989

[54] SINGLE CRYSTAL FILMS OF CUBIC GROUP II FLUORIDES ON SEMICONDUCTOR COMPOUNDS

[75] Inventors: Wilbur D. Johnston, Jr., Mendham; Charles W. Tu, Basking Ridge, both of N.J.

[73] Assignee: American Telephone and Telegraph Company AT&T Bell Laboratories, Murray Hill, N.J.

[21] Appl. No.: 320,884

[22] Filed: Mar. 9, 1989

Related U.S. Application Data

[63] Continuation of Ser. No. 6,989, Jan. 14, 1987, abandoned, which is a continuation of Ser. No. 554,793, Nov. 23, 1983, abandoned.

[51] Int. Cl.$^4$ .................... H01L 29/201; H01L 29/78
[52] U.S. Cl. ................................. 148/33.3; 148/33.4; 148/DIG. 53; 148/DIG. 81; 148/DIG. 169; 357/4; 357/23.15; 357/23.7; 437/84; 437/105; 437/243; 437/962
[58] Field of Search ............. 148/33.3, 33.4, DIG. 81, 148/169, DIG. 53; 156/612, DIG. 78, DIG. 103; 357/4, 23.15, 23.7; 437/84, 105, 243, 962

[56] References Cited

U.S. PATENT DOCUMENTS

| | | | |
|---|---|---|---|
| 3,385,731 | 5/1968 | Weimer | 427/86 |
| 3,405,331 | 10/1968 | Skalski et al. | 437/84 X |
| 3,692,572 | 9/1972 | Strehlow | 156/614 X |
| 4,453,172 | 6/1984 | Farrow | 357/23.15 |

OTHER PUBLICATIONS

"Insulating Epitaxial Films of BaF$_2$, CaF$_2$ and Ba$_x$Ca$_{1-x}$F$_2$ Grown by MBE on InP Substrates", *Journal of Crystal Growth*, 60, P. W. Sullivan et al, 1982, pp. 403–413.

"MBE–Grown Fluoride Films: A New Class of Epitaxial Dielectrics" *Journal of Vacuum Science and Technology*, 19(3), Farrow et al, 1981, pp. 415–420.

"Epitaxial Growth of Lattice Matched Group II Fluorides on GaAs Substrates" *Second European Workshop on Molecular Beam Epitaxy*, C. Fontaine et al, 1983, Abstract.

*Heterostructure Lasers: Part B—Materials and Operating Characteristics*, H. C. Casey, Jr. et al, 1978, Academic Press, New York, Chapter 5.

"Growth of Single–Crystalline epitaxial Group II Fluoride Films on InP(001) by Molecular-Beam Epitaxy", *Journal of the Electrochemical Society* 130(10), C. W. Tu et al, 1983, pp. 2081–2087.

Primary Examiner—William G. Saba
Attorney, Agent, or Firm—Walter G. Nilsen; Bruce S. Schneider

[57] ABSTRACT

Certain semiconductor device structures are described in which single crystal layers of cubic Group II fluorides cover at least part of the surface of III-V semiconductor compound. The fluoride crystal has a cubic structure and may be lattice matched or lattice mismatched to the compound semiconductor substrate depending on fluoride composition. These fluoride single crystal layers are put down by a moleuclar beam epitaxy procedure using certain critical substrate temperature ranges and a particular cleaning procedure.

11 Claims, 1 Drawing Sheet

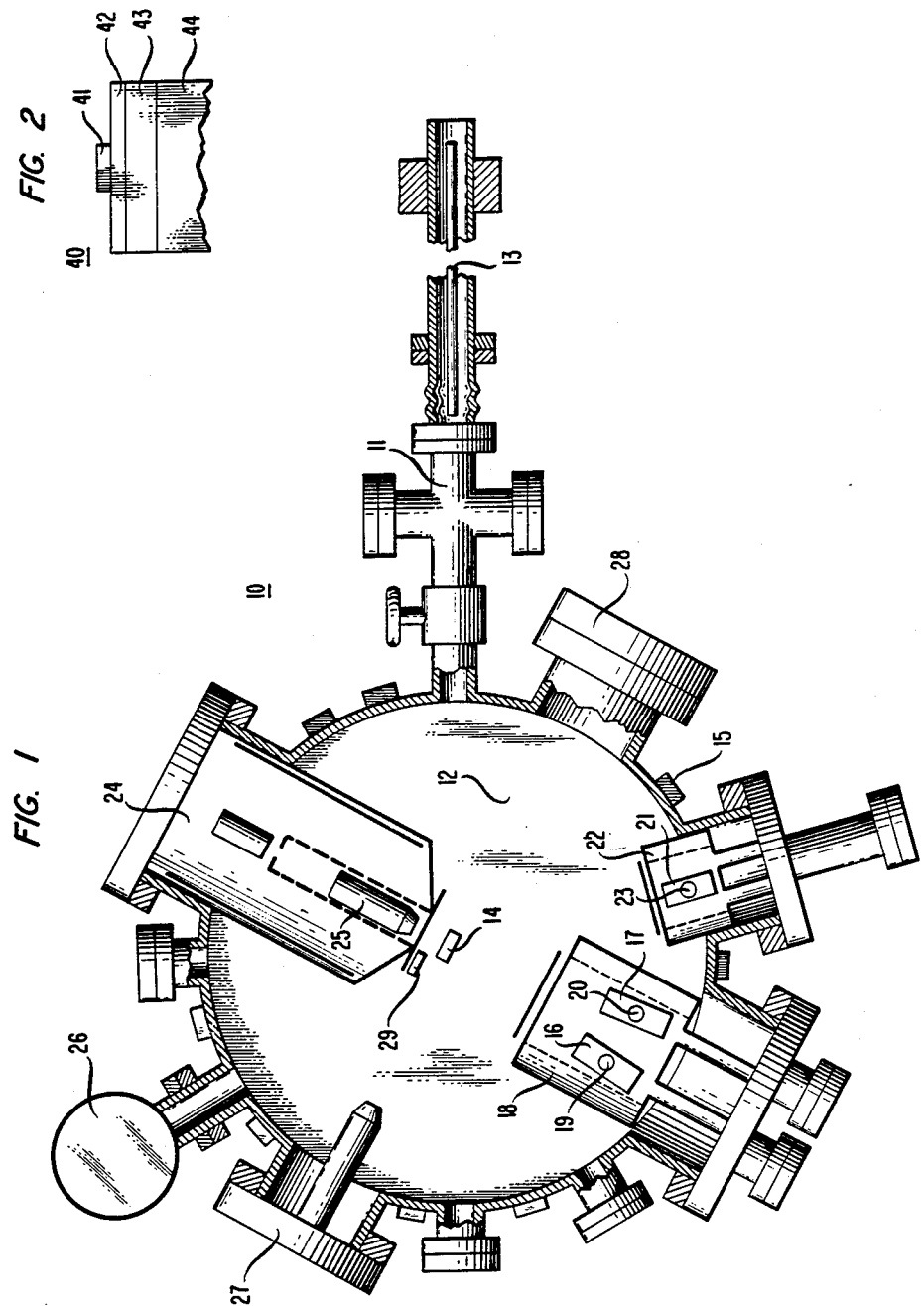

SINGLE CRYSTAL FILMS OF CUBIC GROUP II FLUORIDES ON SEMICONDUCTOR COMPOUNDS

This application is a continuation of application Ser. No. 006,989, filed on Jan. 14, 1987, now abandoned, and application Ser. No. 554,793 filed on Nov. 23, 1983 now abandoned.

TECHNICAL FIELD

The invention is a semiconductor device structure and process for fabricating such a structure.

BACKGROUND OF THE INVENTION

The rapid development of semiconductor technology both in terms of unique and different devices and in higher packing density has led to unique requirements for materials and device structures. Typical examples are the use of better passivating materials, better insulating materials, unique optical materials, etc.

Particularly interesting is a dielectric material which is single crystal and lattice matched to the semiconductor substrate material. Such a structure has a number of potentially interesting applications including passivation, metal-insulator-semiconductor structures, insulator applications in optical semiconductor structures and epitaxial semiconductor-insulator-semiconductor structures.

In many semiconductor structures, minimization of the number of defect states (the trap density) in the interface between two different materials (e.g., between semiconductor and insulator in a metal-insulator-semiconductor structure) is highly desirable. This leads to much better device performance. To minimize trap density, it is desirable to have not only a single crystal layer of insulator lattice matched to the semiconductor but also a crystal structure closely compatible to the semiconductor. In this way, the discontinuity at the insulator semiconductor is minimized so the trap density is minimized.

A number of references have been concerned with epitaxial dielectric layers on various semiconductor surfaces. Particularly interesting are two articles, the first entitled "Insulating Epitaxial Films of $BaF_2$, $CaF_2$ and $Ba_xCa_{1-x}F_2$ Grown on MBE on InP Substrates" by P. W. Sullivan et al, *Journal of Crystal Growth*, 60, pages 403–413 (1982) and a second entitled "MBE-Grown Fluoride Films: A New Class of Epitaxial Dielectrics" by R. F. C. Farrow et al, *Journal of Vacuum Science and Technology*, 19(3), pages 415–420 (September-October 1981). Also of interest is an abstract by C. Fontaine, S. Siskos and A. Munoz-Munoz entitled, "Epitaxial Growth of Lattice Matched Group II Fluorides on GaAs Substrates" appearing in the abstracts for the *Second European Workshop on Molecular Beam Epitaxy*, Sussex University, Brighton, Mar. 27–30, 1983.

SUMMARY OF THE INVENTION

The invention involves semiconductor devices with unique structural features and processes for fabricating such semiconductor devices. The semiconductor involved in the invention is InP and GaAs and various related semiconductor compounds (e.g., which can be lattice matched to GaAs or InP) such as InGaAs, InGaAsP, InGaAlAs and AlInAs. The invention applies to various kinds of doping including n-type, p-type, undoped, compensated, etc. The invention is a semiconductor device structure in which at least part of the surface of the semiconductor is covered with an epitaxial film of cubic Group II fluoride which is twin-free and single crystal. The cubic Group II fluoride may be lattice mismatched or lattice matched. Typical Group II cubic fluorides are $BaF_2$, $SrF_2$, $CaF_2$, $Ca_xSr_{1-x}F_2$ and $Ba_xSr_{1-x}F_2$. The latter mixed fluorides may be varied in composition for lattice matching purposes. Generally, the $Ba_xSr_{1-x}F_2$ may be lattice matched to InP and other III-V compound semiconductors (e.g., ternary and quaternary compounds such as GaInAs and GaInAsP) with approximately the same lattice constants as InP. Such ternary and quaternary compounds are $Al_xIn_{1-x}As$ with $x=0.48$, $Ga_xIn_{1-x}As$ with $x=0.47$, $Ga_xIn_{1-x}As_yP_{1-y}$ with x and y ranging over large values including x from 0.26 to 0.40 and y from 0.60 to 0.91, and InGaAlAs with various amounts in indium, gallium, and aluminum. The mixed fluoride system $Ca_xSr_{1-x}F_2$ may be lattice matched to GaAs and other III-V compound semiconductors with similar lattice constants to GaAs. Such epitaxial, single crystal layers are of extreme interest for a variety of reasons. First, the fluorides provide extremely high insulation. Second, the crystal structure of the Group II cubic fluorides are closely compatible so that the density of defect states in the interface between insulator and semiconductor is expected to be minimized.

The invention also includes a process for producing these single crystal films. It involves a molecular beam epitaxial procedure with a particular cleaning procedure and critical substrate temperature range for deposition.

BRIEF DESCRIPTION OF THE DRAWINGS

FIG. 1 shows a schematic of a molecular beam epitaxial apparatus useful in the practice of the invention; and FIG. 2 shows a typical metal-insulator-semiconductor structure where the invention is usefully applied.

DETAILED DESCRIPTION

The invention involves certain device structures and processes for making these device structures. For convenience, the device structures are described first.

In broad terms, the device structures comprise III-V semiconductor with a crystalline dielectric layer of fluoride grown on top of the semiconductor. Generally, the III-V semiconductor is a diatomic compound such as InP or GaAs. Included in the invention are Group III-V semiconductor compounds which have lattice constants close to the Group II cubic fluorides or their solid solutions. Lattice constants for the fluorides of interest in Angstroms are $BaF_2$-6.2001; $CaF_2$-5.4640; and $SrF_2$-5.7996. For the solid solution system $Ca_xSr_{1-x}F_2$, the lattice parameters range from 5.4640 to 5.7996 and for the solid solution system $Ba_xSr_{1-x}F_2$, the lattice parameter varies from 5.7996 to 6.2001.

Also included in the invention are various substrates (including substrates of III-V compounds) with one or more epitaxial layers of III-V semiconductor compound or semiconductor compounds with crystalline layer of cubic fluoride on top of the epitaxial layer of III-V compound semiconductor. An exemplary structure is an InP substrate covered with a thin layer of lattice matched GaInAs (e.g., $Ga_{0.47}In_{0.53}As$).

A variety of devices advantageously use an interface between single crystal III-V compound semiconductor and single crystal cubic fluoride layer. Typical among these are metal-insulator semiconductor structures 40 such as shown in FIG. 2. Here, an InP substrate 44 is shown with an epitaxial layer 43 of III-V semiconductor on top of said substrate. The crystalline fluoride layer 42 separates the semiconductor epitaxial layer from a metal electrode 41. Various devices include such a structural unit.

An important aspect of the invention is that the fluoride film is single crystal and can be, but does not necessarily have to be, lattice matched to the adjacent III-V semiconductor. For the (001) surface of InP, both $SrF_2$ and $CaF_2$ yield substantially twin-free single crystal films. In addition, $Ba_xSr_{1-x}F_2$ yields substantially twin-free single crystalline films. Also, by appropriate adjustment of composition x, this solid solution system can be lattice matched to InP or any other III-V compound with lattice constant within the $Ba_xSr_{1-x}F_2$ system (roughly ranging from 5.7996 to 6.2001 Angstrom Units). At room temperature, the value of x required to lattice match the insulating layer to InP is approximately 0.17. For GaAs, twin-free single crystal is obtained with $CaF_2$, $SrF_2$ as well as mixed crystals of $Ca_xSr_{1-x}F_2$. By appropriate adjustment of the composition of $Ca_xSr_{1-x}F_2$, this mixed fluoride system can be lattice matched to GaAs or any III-V semiconductor compound with lattice parameters in the range between $CaF_2$ and $SrF_2$ (5.4640-5.7996 Angstroms). A list of ternary and quaternary III-V compound semiconductors that can be lattice matched to InP or GaAs is given in a book by H. C. Casey, Jr. and M. B. Panish entitled, *Heterostructure Lasers: Part B-Materials and Operating Characteristics*, Academic Press, New York (1978), Chapter 5. For example, a variety of ternary and quaternary systems can be lattice matched to GaAs including AlGaAs (throughout its composition range), $Ga_xIn_{1-x}P$ with x equal to approximately 0.51, $Al_xIn_{1-x}P$ with x equal to approximately 0.51 and $Ga_xIn_{1-x}P_yAs_{1-y}$.

The value of x necessary to lattice match the mixed fluoride to the III-V semiconductor compound is easily determined since Vegard's law is obeyed (the lattice constant of the mixed fluoride is a linear function of composition).

A particularly important aspect of the invention is the single crystal nature of the cubic Group II fluoride films. It is this aspect of the invention that yields the unique properties of the devices including potentially lower defect density at the semiconductor-insulator interface, improved electrical properties of the semiconductor-insulator interface including reduced capacitance, etc.

To demonstrate the unique qualities of the insulator layers, various experiments were carried out to show that the layers were essentially single-crystal films. The crystalline films were exposed to reflection high-energy electron diffraction (RHEED) experiments to show the single-crystal nature of the films. For example, $CaF_2$ films grown on the (001) plane of InP at a growth temperature of 350 degrees C. yielded sharp spot patterns in RHEED with no evidence of polycrystalline rings. Films of $BaF_2$ and $SrF_2$ also show good RHEED spot patterns.

Measurements were also carried out using Nomarski interference-contrast microscopy on thick films (about 4000 Angstroms). These measurements showed crazing along the <110> directions probably due to stress from lattice misfit. Films of $BaF_2$ exhibit the most crazing, $SrF_2$, the least crazing. Crazing was not detected where a mixture of fluorides was grown to achieve lattice matching to the substrate, provided the film thickness is less than about one micrometer. (Because the thermal expansion coefficients of these films and substrates differ, thicker films craze on cooling from the growth to room temperature.)

Transmission electron microscopy (TEM) measurements were also carried out on a variety of cubic Group II fluoride films. These measurements showed that $BaF_2$ films grown at high substrate temperatures remain polycrystalline with the crystals strongly oriented along the (001) direction. Other crystals such as the $SrF_2$ crystal film show high quality single crystal films. Similarly, TEM measurements of $CaF_2$ films on InP made at substrate temperatures of about 350 degrees C. show no evidence of polycrystalline rings. These films are single crystal with no defects or evidence of twinning.

Mixed fluoride films (e.g., $Ba_xSr_{1-x}F_2$) were also grown on the (001) plane of InP. The composition of the mixed fluoride (value of x) was adjusted so that the lattice parameter of the mixed fluoride was lattice matched to the InP. This was done in two ways. One way involved using individual ovens for $BaF_2$ and $SrF_2$ and adjusting the temperature of each oven so as to obtain the desired composition. The other way involved use of a mixed single crystal of the desired composition as the single source. The lattice parameter was measured using a double-crystal x-ray diffractometer. These films were also single-crystal without twinning as evidenced by TEM micrographs.

Also of particular importance in the invention is the process for putting down the cubic Group II fluoride. The process is a molecular beam epitaxial procedure for producing a fluoride layer which is single crystal. Here, the surface preparation procedure for the semiconductor surface and the temperature of the semiconductor substrate are particularly important.

Although various conventional molecular beam epitaxial apparatus (MBE apparatus) may be used, it is useful in understanding the invention to describe the apparatus used. The apparatus has been described by C. W. Tu et al, *Journal of the Electrochemical Society* 130, 2081 (1983). A schematic of the MBE apparatus is shown in FIG. 1. The MBE system consists of a loadlock 11 and an 18 inch diameter RHEED chamber 12. The loadlock has a magnetically coupled transfer rod 13 for withdrawal of the sample 14 and is pumped with an 8 liter/second ion pump (not shown). The main chamber is pumped by a 500 liter/second ion pump (not shown). An inert tube 15 is shown for admitting chilled water to cool the main chamber. Also shown are two Knudson cells 16 and 17 surrounded by a liquid nitrogen shroud 17 and containing pieces of crystalline fluorides 19 and 20. A third single cell 21 is also shown with liquid nitrogen shroud 22. This cell contains undoped polycrystalline InP 23 and is used as a phosphorus source. Base pressures in the mid $10^{-11}$ Torr range can be obtained in the chamber with this system but normally between runs, the base pressure is maintained in the 1 cw $10^{-10}$ Torr range. During film growth, the pressure is typically about $2-5 \times 10^{-9}$ Torr. The MBE chamber contains a cylindrical-mirror analyzer 24 with an integral electron gun 25 for Auger analysis; a residual-gas analyzer 26 for monitoring background gas composition and phosphorus overpressure during substrate cleaning; a 5 keV RHEED gun 27 a phosphorus screen 28 and a thin-film quartz monitor 29 for thickness monitoring. The film thickness and refractive index were measured with an ellipsometer. Various other MBE apparatus may be used but the apparatus described above is particularly convenient.

Certain features of the MBE procedure should be adhered to so as to reliably produce single crystal fluoride films. First, a cleaning procedure must be carried out so as to yield an oxide-free surface that is stoichiometric. This is done by heating the semiconducting material to a high enough temperature (usually 400-700 degrees C.) in the MBE apparatus under vacuum to remove the oxide coating while using the molecular beam to maintain the stoichiometry of the surface. This may be accomplished by maintaining a molecular beam of the more volatile component, conveniently done by heating the same III-V compound in the source cell. Thus, this may be done by exposing the InP substrate to a phosphorus beam while heating the substrate to a temperature range between 400-600 degrees C. with pressure less than $10^{-4}$ Torr. Preferred pressure is less than $10^{-5}$ Torr (e.g., $10^{-5}$–$10^{-6}$ Torr) and preferred temperature 500±50 degrees C.

A typical cleaning procedure is described in detail. The experiments were carried out on sulfur-doped (approximate doping level of $8 \times 10^{18}$ cm$^{-3}$) n-type InP substrates. The (001) face was used but the invention is applicable to any crystalline orientation. The substrate was polished using a chemical polishing solution (e.g., bromine-methanol) to remove most of the oxide coating and any other surface impurities. The final polishing was carried out with a one percent solution of bromine in methanol. The sample was then rinsed with methanol and spun dry. The quality of the polish was checked by the amount of scattering of a laser beam on the polished surface of the substrate. Various measurements using Auger signals for carbon and oxygen and RHEED patterns indicated that some oxide films remained on the surface.

The final cleaning procedure involved heating the substrate in an MBE apparatus under a molecular beam of phosphorus. The substrate was heated to about 500±50 degrees C. under a phosphorus beam from a Knudsen cell containing polycrystalline InP pieces. The total pressure in the chamber, as determined by an ion gauge, was greater than about $3 \times 10^{-6}$ Torr during exposure. Exposure times between 2 minutes and 3 hours were sufficient to remove surface contaminants with 10 minutes the normally preferred time. The gas composition during exposure was monitored by a residual gas analyzer which showed mostly phosphorus. Various measurements on the surface of the InP showed that this procedure yielded a contamination-free surface which was stoichiometric. For GaAs, an arsenic beam is used often from a molecular beam oven containing elementary arsenic ($As_4$). The substrate temperature is typically 600±50 degrees C.

The films are put down by more or less conventional MBE procedures. To obtain single crystal films, particular attention must be paid to substrate temperature and growth rate. In general, the temperature of the III-V semiconductor compound should be within the 150 degree C. range below the decomposition temperature of the III-V semiconductor compound. The slowest rate of deposition which still yields single crystal is about 250 Angstroms per hour. For example, with InP, films may be grown with substrate temperatures between 250 and 350 degrees C. because of the congruent evaporation point of InP (about 365 degrees C.). From a practical point of view, a high temperature limitation of 350 degrees C. seems most suitable to ensure that the InP remains undamaged.

A relatively high temperature range, namely 300–350 degrees C., is preferred because of the ease of obtaining single crystal films and the higher rate of deposition which can be achieved with resulting single crystal films. Most preferred is a substrate temperature of 350±10 degrees C. Under these conditions, growth rates of approximately 3000 Angstroms per hour have been achieved with excellent quality single crystal films.

A number of experiments were carried out to demonstrate the usefulness of the MBE technique in growing single crystal films on InP. Films of $CaF_2$ were grown on the (001) face of InP. The substrate temperature was about 350±10 degrees C. and the growth rate was approximately 600 Angstroms per hour. RHEED patterns taken of the resulting $CaF_2$ films showed no evidence of polycrystalline rings but showed sharp spot patterns indicative of a single crystal film. Transmission electron microscopy measurements also show that the $CaF_2$ films grown as described above are single crystal.

Experiments were also carried out with $SrF_2$ and $BaF_2$. Excellent results are obtained with $SrF_2$ as evidenced by transmission electron microscopy (TEM) measurements. The $BaF_2$ films showed crazing occurring on the {111} cleavage planes probably due to the excessive lattice mismatch with InP.

The process was also applied to the deposition of a mixture of fluorides. Particularly interesting is the mixture of $BaF_2$ and $SrF_2$ since such a mixture can be lattice matched to InP. Experiments were carried out on the (001) face of InP at a substrate temperature of about 350 degrees C. The $BaF_2$ and $SrF_2$ were contained in individual ovens as shown in FIG. 1. The rate of deposition of $BaF_2$ and $SrF_2$ was adjusted by adjusting the temperature of the two ovens. The films of mixed fluoride obtained in this way were single crystal and showed no evidence of twinning. In addition, measurements on a 4000 Angstroms film that was lattice matched to the InP showed no crazing under Nomarski interference contrast microscopy.

Although these experiments did yield excellent results, and also because of the different proximity of the $BaF_2$ and $SrF_2$ source, there were some variations in composition and lattice parameter across the film composition substrate. This variation may be removed in two ways. First, the substrate may be rotated so as to ensure uniform composition of the entire surface. Because of the low rate of deposition, the rate of rotation may be quite small, perhaps as small as one revolution per minute. Higher rates of rotation may also be used (e.g., 60 revolutions per minute).

Another procedure for ensuring uniform deposition over the entire surface of the substrate is to use a single source in the form of a solid solution of $BaSrF_2$. The source may be prepared in a variety of ways well known in the art provided such preparation procedure yields crystals of high purity. In particular, exclusion of water and oxygen is of particular importance. A typical preparation is to zone-refine in a dry HF atmosphere the separately zone-refined $BaF_2$ and $SrF_2$ crystals. This procedure ensures the highest purity fluoride crystals.

Initial experiments were carried out using a fluoride composition which lattice matched InP. However, initial experiments showed that the source evaporated noncongruently at the operating source temperature (about 1200 degrees C.) so that the resulting film was rich in $BaF_2$. The noncongruent evaporation was confirmed by measuring the composition of source material after the MBE experiments. These measurements were carried out by x-ray fluorescence spectroscopy and showed that the source material was deficient in $BaF_2$. Adjustments of the composition of $Ba_xSr_{1-x}F_2$ yield lattice matched single-crystal films. Transmission electron microscopy measurements showed that the films of $Ba_xSr_{1-x}F_2$ are indeed single crystal. For GaAs, the growth temperature range is from 300 to 600 degrees C.

What is claimed is:

1. A semiconductor device comprising semiconductor material, said semiconductor material consisting essentially of at least one III-V semiconductor compound in which at least part of the surface of the semiconductor material is covered with an insulating film characterized in that the insulating film is an epitaxial film of cubic Group II fluoride which is grown in the temperature range of 150 degrees C. below the decomposition temperature of the III-V semiconductor and at a growth rate of least 250 Angstroms per hour and is substantially twin-free and substantially single crystal, and the cubic Group II fluoride is selected from the group consisting of $Ca_xSr_{1-x}F_2$ and $Ba_ySr_{1-y}F_2$ where x and y vary from 0 to 1.

2. The semiconductor device of claim 1 in which the III-V semiconductor compound is selected from the group consisting of:
   (a) InP,
   (b) $Al_xIn_{1-x}As$ with x equal to approximately 0.48,
   (c) $Ga_xIn_{1-x}As$ with x equal to approximately 0.47, and
   (d) $Ga_xIn_{1-x}As_yP_{1-y}$ with x varying from 0.26 to 0.40 and y varying from 0.60 to 0.91.

3. The semiconductor device of claim 2 in which the III-V semiconductor compound is InP.

4. The semiconductor device of claim 3 in which the surface of the semiconducting material is a (001) surface.

5. The semiconductor device of claim 4 in which the cubic Group II fluoride is selected from the group consisting of $CaF_2$ and $SrF_2$.

6. The semiconductor device of claim 4 in which the cubic Group II fluoride is $Ba_xSr_{1-x}F_2$ and x is adjusted so that the $Ba_xSr_{1-x}F_2$ is lattice matched to InP.

7. The semiconductor device of claim 1 in which the III-V semiconductor compound is selected from the group consisting of:
   (a) GaAs,
   (b) AlGaAs,
   (c) $Ga_xIn_{1-x}P$ with x equal to about 0.51,
   (d) $Al_xIn_{1-x}P$ with x equal to about 0.51, and
   (e) $Ga_xIn_{1-x}P_yAs_{1-y}$.

8. The semiconductor device of claim 7 in which the III-V semiconductor compound is GaAs.

9. The semiconductor device of claim 8 in which the surface of the semiconducting material is a (001) surface.

10. The semiconductor device of claim 9 in which the cubic Group II fluoride is selected from the group consisting of $CaF_2$ and $SrF_2$.

11. The semiconductor device of claim 9 in which the cubic Group II fluoride is $Ca_xSr_{1-x}F_2$ and x is adjusted so that the $Ca_xSr_{1-x}F_2$ is lattice matched to GaAs.

* * * * *